(12) United States Patent
Mirow

(10) Patent No.: US 7,504,901 B2
(45) Date of Patent: Mar. 17, 2009

(54) SUPPLY VOLTAGE CONTROLLED VOLTAGE AND TEMPERATURE COMPENSATED OSCILLATOR

(76) Inventor: Fred Mirow, 118 Cornell Rd., Bala Cynwyd, PA (US) 19004

( * ) Notice: Subject to any disclaimer, the term of this patent is extended or adjusted under 35 U.S.C. 154(b) by 276 days.

(21) Appl. No.: 11/286,514

(22) Filed: Jan. 20, 2006

(65) Prior Publication Data

US 2007/0241831 A1    Oct. 18, 2007

Related U.S. Application Data

(60) Provisional application No. 60/631,353, filed on Nov. 29, 2004.

(51) Int. Cl.
*H03L 1/00* (2006.01)

(52) U.S. Cl. .................. 331/176; 331/57; 331/185

(58) Field of Classification Search .................. 331/57, 331/176, 185
See application file for complete search history.

(56) References Cited

U.S. PATENT DOCUMENTS

| 5,705,957 A | * | 1/1998 | Oka et al. | 331/66 |
| 5,847,616 A | * | 12/1998 | Ng et al. | 331/57 |
| 6,853,259 B2 | * | 2/2005 | Norman et al. | 331/66 |

* cited by examiner

*Primary Examiner*—Arnold Kinkead

(57) ABSTRACT

A FET oscillator with increased frequency stability. This is accomplished by using a controlled voltage supply with error correction to power the amplifier stage of the oscillator. This voltage changes as the oscillator temperature increases in order to reduce the variation in frequency, caused by the amplifier and other frequency determining components changes. By using this compensated amplifier as the active section of an oscillator, the oscillator frequency stability is increased.

7 Claims, 5 Drawing Sheets ically the phase shift of amplifier 11 and feedback network 10 to minimize the change in the frequency of oscillation as the temperature varies.

SUPPLY VOLTAGE CONTROLLED VOLTAGE AND TEMPERATURE COMPENSATED OSCILLATOR

CROSS-REFERENCE TO RELATED APPLICATIONS

The benefits of filing this invention as Provisional application for patent "SUPPLY VOLTAGE CONTROLLED VOLTAGE AND TEMPERATURE COMPENSATED OSCILLATOR", U.S. PTO 60/631,353 filed Nov. 29, 2004 by Fred Mirow are claimed.

BACKGROUND OF THE INVENTION

This invention relates to FET oscillators in which the oscillation frequency is relatively independent of supply voltage and ambient temperature. The term FET is used to refer to CMOS, MOSFET, JFET and other variation of the Field Effect Transistor.

One of the problems associated with FET oscillators at high frequency is that the oscillation frequency is very sensitive to changes in ambient temperature and power supply voltage. To reduce this instability some form of compensation is necessary. One of the methods used is to use a FET as a resistor to control the charging time of a capacitor. The FET resistance value is controlled by a temperature dependent voltage which varies to maintain a constant capacitor charging time. This is described in U.S. Pat. No. 4,547,749 issued to Clinton Kuo. Another method is to use a constant current source circuit, which is designed to be temperature independent, to charge and discharge a timing capacitor. This is described in U.S. Pat No. 4,714,901 issued to Jain et al.

In these methods the variation in oscillator frequency has been reduced by controlling the charging time of capacitors, but nothing has been done to correct an other large error source, the high sensitivity of the FET amplifier to temperature and supply voltage change.

A solution to this was taught in U.S. Pat. No. 5,241,286 issued to Mirow on Aug. 31, 1993. Mirow taught a oscillator in which the frequency stability is increased by reducing the change in the amplifier circuit gain and phase shift due to variations in ambient temperature and power supply voltage. This reduction is accomplished by powering the amplifier from a power supply in which the output voltage level varies with temperature. However Mirow did not take into account non linear frequency shift or show how to reduce errors in the supply voltage verses temperature curve.

SUMMARY OF THE INVENTION

The object of this invention is a FET oscillator in which the frequency stability is increased by reducing the change in the circuit gain and phase shift due to variations in ambient temperature and power supply voltage. In addition, a controlled change in the amplifier circuit gain and phase shift can also be used to further increase frequency stability by canceling the effects due to variations in the feedback network with ambient temperature and power supply voltage. This increased frequency stability is accomplished by powering the amplifier from a voltage supply in which the output voltage level varies with temperature.

In one embodiment, the voltage supply includes a temperature responsive voltage regulator to maintain the oscillator frequency constant as operating temperature and power supply voltage changes. In another embodiment, the voltage supply includes a look-up table embodying a desired supply voltage versus temperature relationship. In another embodiment, the voltage supply includes a temperature sensitive voltage supply and a additional signal from the error corrector. The error corrector may be a look-up table embodying a desired correction to the supply voltage versus temperature relationship or temperature responsive comparators for supply voltage adjustments at predetermined temperatures.

In multivibrators type oscillators further improvements in oscillator frequency stability are obtained by limiting the oscillator feedback signal voltage level in response to temperature.

In addition to using the compensated oscillator to provide a constant frequency the oscillator can be modulated to provide a frequency signal that varies about a stable center frequency creating a spread spectrum oscillator. The oscillator is modulated by using an additional oscillator that causes the voltage supply output voltage level to vary in response to this oscillators frequency. The voltage supply's output voltage level now changes in response to temperature and also the additional oscillator.

BRIEF DESCRIPTION OF THE

The invention will be described in detail hereinafter with reference to the accompanying drawings; in which FIG. 1 is a schematic representation of the circuit of the present invention;

DETAILED DESCRIPTION OF THE INVENTION

Figure 1:
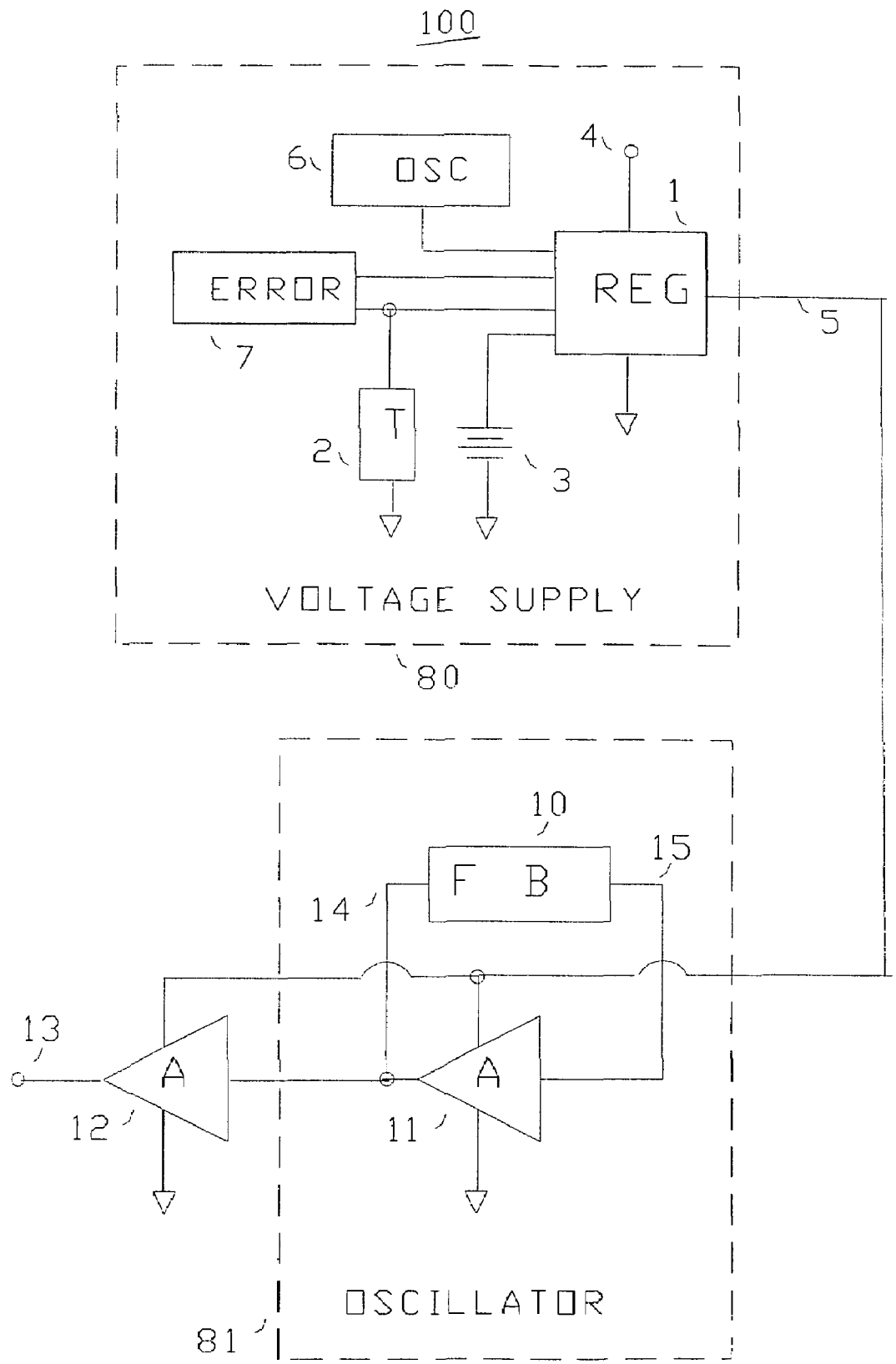

Shown in FIG. 1 is compensated oscillator 100 comprising oscillator 81, buffer amplifier 12, and voltage supply 80. The oscillator 81 consist of feedback network 10 and amplifier 11. Feedback network 10 is connected to the input and output of amplifier 11 by lines 14 and 15. Amplifier 11 has a phase shift of about 180 degrees and feedback network 10 supplies the remaining phase shift necessary to make the total phase shift at the frequency of oscillation 360 degrees. If amplifier 11 is not an inverter, than the feedback network 10 will provide the required phase shift amount to have 360 degrees total. The phase shift provided by feedback network 10 varies with frequency. There are many well known phase shift networks that can be used such as the twin T and the Wien bridge. One practical means well known by those skilled in the art of implementing amplifier 11 is to use a CMOS inverter. Buffer Amplifier 12 provides isolation between the oscillator 81 output on line 14 and any load connected to oscillator output 13. It may be overdriven to provide a square wave output signal. The voltage to power amplifier 12 may come from terminal 4 instead of line 5. Amplifier 11 phase shift and gain are effected by the voltage on line 5 and ambient temperature. Amplifier 11 and feedback network 10 are thermally coupled and essential at the same temperature. Line 5 supplies the voltage to power the amplifier from voltage supply 80. The effect of temperature is that as the temperature increases the phase shift of amplifier 11 and feedback network 10 changes causing the frequency of oscillation to change. The effect of temperature on amplifier 11 and feedback network 10 is substantially canceled by changing the voltage on line 5. Thus the voltage on line 5 serves as a frequency control signal to adjust the output frequency of oscillator 81 to it's original frequency and remain constant over temperature and input voltage.

Voltage supply 80 FIG. 1 receives a DC input voltage at terminal 4 and provides a predetermined voltage on line 5 in response to Amplifier 11 temperature and oscillator 6. Voltage supply 80 consist of voltage regulator 1, voltage reference 3, temperature sensor 2, error corrector 7 and oscillator 6. Voltage regulator 1 may use an operational amplifier or an other well known voltage regulator circuit along with voltage reference 3 and temperature sensor 2. Temperature sensor 2 can be a semiconductor such as a diode or a temperature sensitive resistor. Voltage regulator 1 may instead use other well known voltage reference circuits into which temperature sensor 2 and voltage reference 3 are integrated. Voltage regulator 1 output on line 5 is a DC voltage that is nominally set by voltage reference 3 and varies in a controlled manner with the temperature change of temperature sensor 2 which is thermally coupled to amplifier 11 and also feedback network 10. Temperature sensor 2 can be formed on the same substrate as Amplifier 11 transistors to provide good thermal coupling. Error corrector 7 causes an additional predetermined change to Voltage regulator 1 output in response to temperature sensor 2 at temperatures where additional frequency correction is needed due to the variation of line 5 voltage with temperature not exactly following the correct variation required to maintain constant frequency. Error corrector 7 output correction signal on line 8 is applied to the input of voltage regulator 1. Oscillator 6 is used only when it is desired to have oscillator 81 provide a frequency signal that varies about a stable center frequency. The Oscillator 6 AC output voltage is connected to the input of voltage regulator 1 causing the voltage on line 5 to have an AC voltage added to the predetermined DC voltage.

Figure 2:
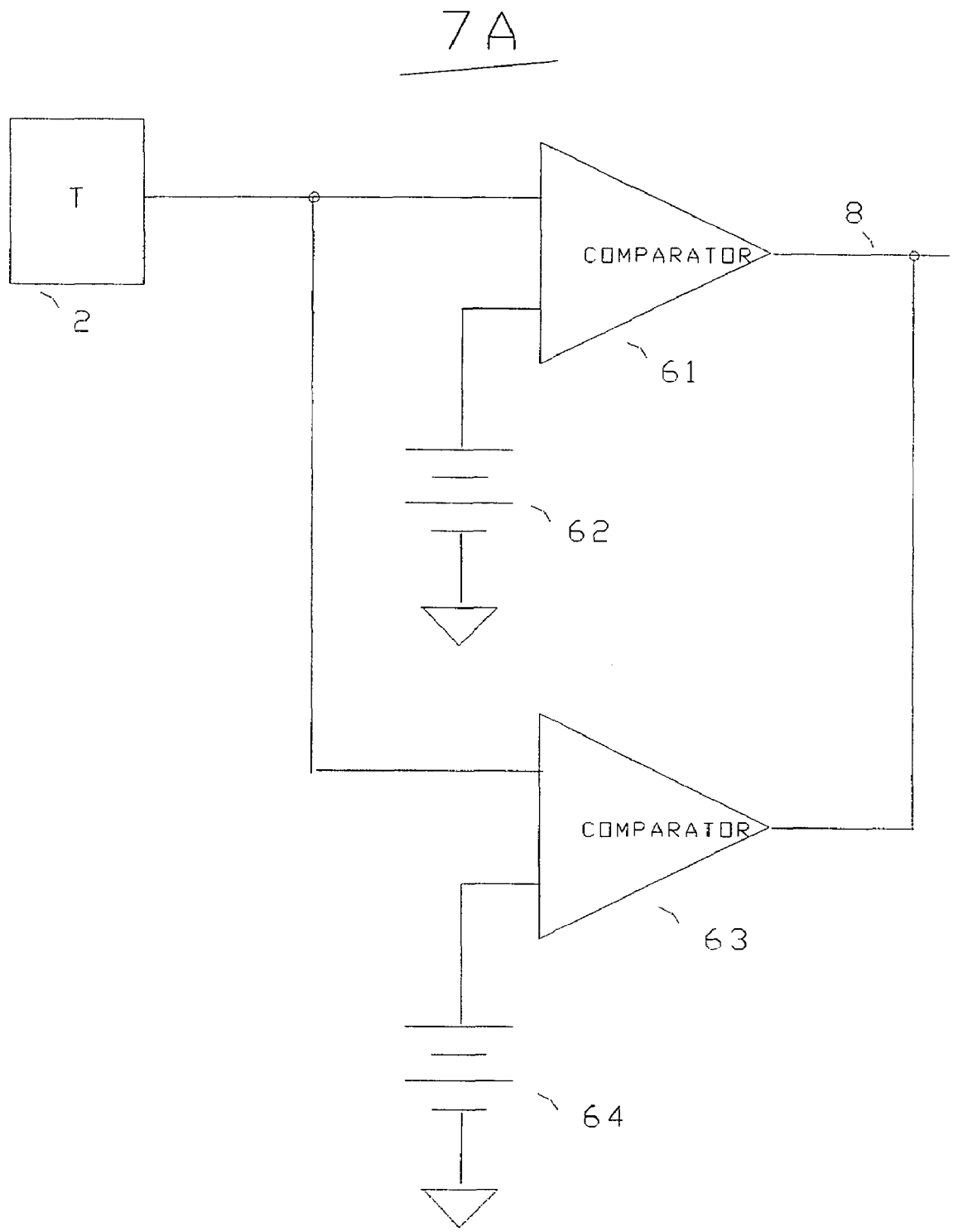
FIG. 2 is a schematic representation of Error Corrector 7A.

Referring now to FIG. 2 a practical means of implementing Error corrector 7 is shown. Error corrector 7A consist of temperature sensor 2, temperature references 62 and 64, and comparators 61 and 63. Temperature sensor 2 applies a signal level corresponding to the measured temperature to the inputs of comparators 61 and 63. Comparator 61 turns on when the temperature of temperature sensor 2 produces a signal level exceeding the temperature reference 62 signal level connected to the other input of comparator 61. When Comparator 61 is on a correction signal of predetermined value is applied to line 8. The signal level of temperature reference 62 is set to a value that corresponds to the minimum temperature that comparator 61 is desired to be turned on at. The correction signal level was predetermined to be the value needed to maintain maximum frequency stability verses temperature. Conversely, comparator 61 may also be connected so as to turn off when the temperature increases and the signal level at its input exceeds the signal level of temperature reference 62. The operation of comparator 63 is identical to that of comparator 61 except that it's other input is connected to temperature reference 64. Temperature reference 64 signal level may be set to a different level than temperature reference 61. Additional temperature references, and comparators may be added with all the output correction signals added together on line 8 to provide additional frequency correction at different temperature levels to maintain the least variation of frequency with variation of temperature.

Figure 3:
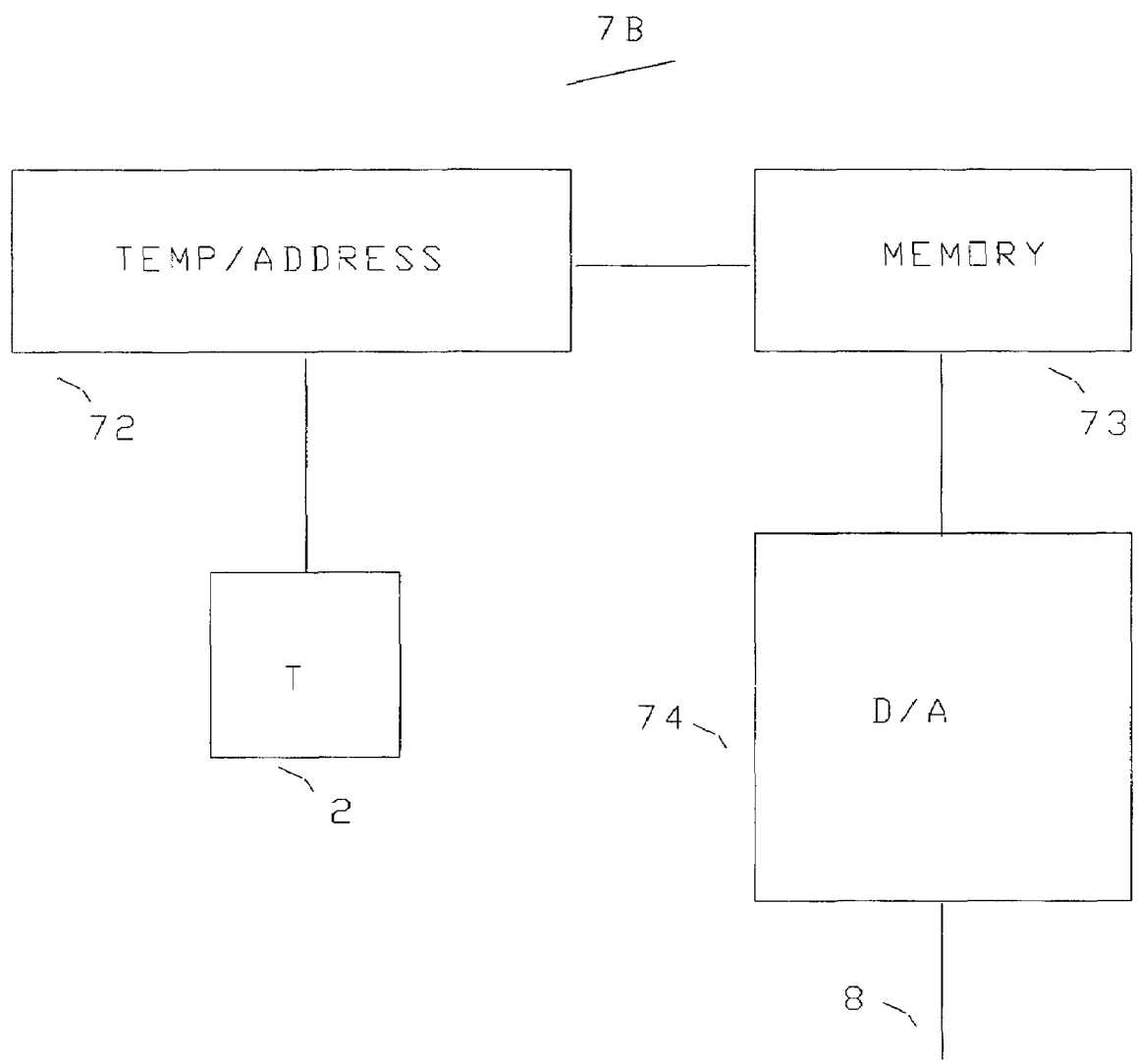
FIG. 3 is a schematic representation of Error Corrector 7B.

An other approach to implementing error corrector 7 is error corrector 7B FIG. 3. The output of temperature sensor 2 which provides an signal corresponding to the measured temperature to the input of address generator 72. Address generator 72 provides a digital output corresponding to the input signal level. Address generator 72 digital output is connected to the input of memory 73. Memory 73 output is a stored digitally coded signal level corresponding to each input signal value. Memory 73 digital output is connected D/A 74 which converts the digitally coded signal level at it's input to an output analog correction signal applied to line 8. The signal applied to line 8 provides additional frequency correction at different temperature levels to maintain the least variation of frequency with variation of temperature.

Figure 4:
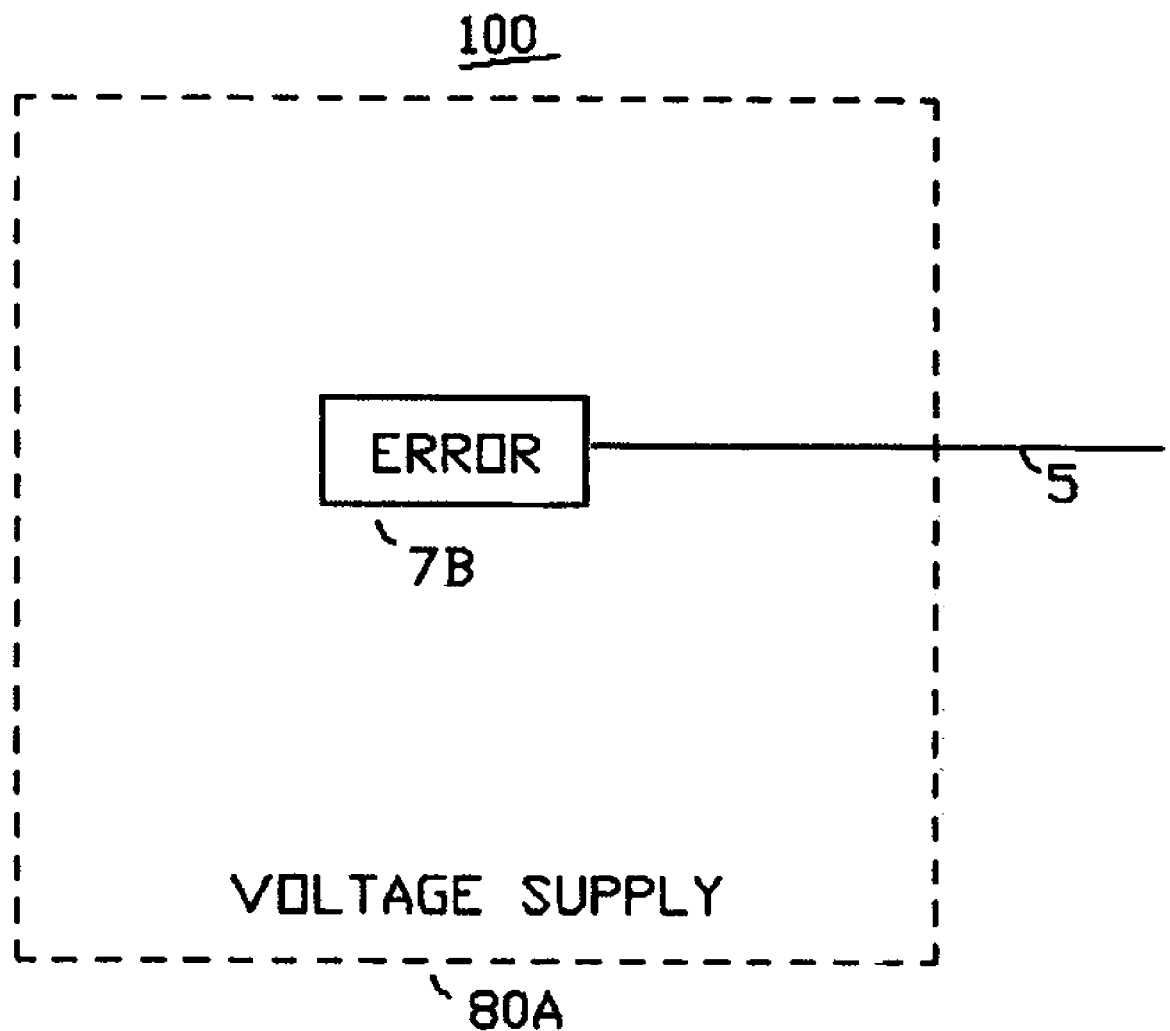
FIG. 4 is a schematic representation of an alternate Voltage Supply 80A.

Also, as shown in FIG. 4 corrector 7B may be used to directly supply the voltage on line 5 without using regulator 1 when Memory 73 has a large enough memory to store enough correction signal values at corresponding temperatures to maintain the desired oscillator 81 frequency accuracy. The result is that for each temperature level measured by temperature sensor 61 a predetermined error correction signal is applied to line 5. The correction signal level was predetermined to be the value needed to maintain maximum frequency stability at different temperature levels.

Figure 5:
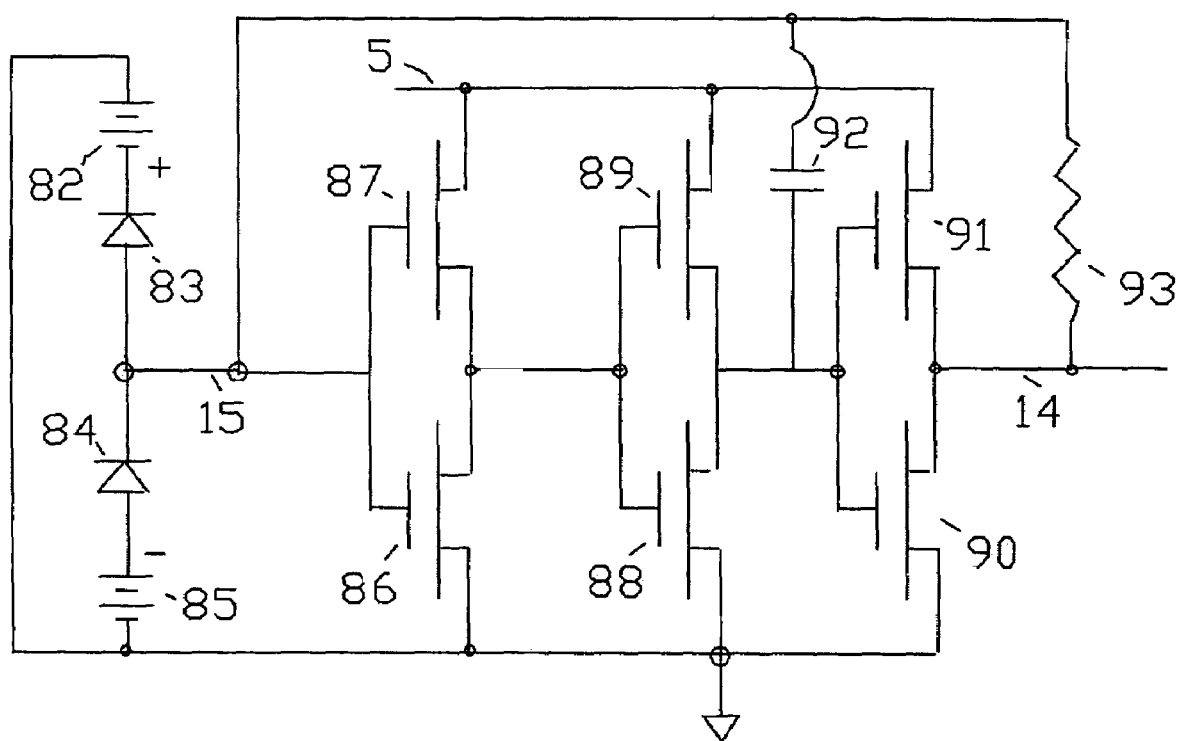
FIG. 5 is a schematic representation of Astable Multivibrator 81A.

Referring now to FIG. 5, oscillator 81A is shown. Oscillator 81A is one possible alternate embodiment of oscillator 81. Oscillator 81A is configured as a astable multivibrator. The astable multivibrator is well known by those skilled in the art. Three CMOS inverting amplifiers are used to provide the necessary gain. The first amplifier input is connected to line 15 and consist of PMOS 87 and NMOS 86. The output of which is connected the input of the second amplifier consisting of PMOS 89 and NMOS 88. The output of which is connected to capacitor 92 and also to the input of the third amplifier consisting of PMOS 91 and NMOS 90. The output of which is connected to resistor 93 and line 14. The oscillator frequency is primarily determined by the time constant of the feedback network consisting of resistor 93 and capacitor 92. This oscillator has been modified to obtain additional improvements in oscillator frequency stability by adding one or more diodes that limit the oscillator feedback signal voltage level. The diodes are thermally coupled to the Amplifier 11 and the feedback network so as to be at essentially the same temperature.

The oscillator frequency is additionally effected by diodes 84 or 83 conducting and limiting the peak voltage level on line 15. Diode 83 is connected between a voltage supply 82 and line 15 such that the diode only conducts when the voltage on line 15 is greater than voltage supply 82 level plus the diode 83 forward voltage drop. Diode 84 is connected between voltage supply 85 and line 15 such that the diode 84 only conducts when the voltage on line 15 is less than the sum of voltage supply 85 and the diode 84 forward voltage drop. Voltage supply 82 is a voltage greater than ½ the level on line 5 and voltage supply 85 is a voltage less than ½ the level on line 5. As an example when line 5 equals 4 volts diode 83 conducts when line 15 exceeds 4 volts and when line 15 is less than 0 volts diode 84 conducts. As the resistance levels of resistor 93 and the PMOS 9 and NMOS transistors increase with temperature the oscillator frequency is reduced. However diodes 83 and 84 forward voltage drop is also temperature sensitive. The voltage drop across diodes 83 and 84 decreases with temperature. The reduced feedback signal amplitude on line 15 causes the oscillator frequency to increase. By setting the voltage levels of voltage supply 82 and 85 to predetermined value the temperature effects on oscillator frequency is reduced and a more constant frequency is maintained as temperature varies. The circuit can also maintain a constant frequency verses temperature by using only one of the diodes 84 or 83. The use diodes 84 or 83 is also applicable to other well known multivibrator circuits.

Although the above description has been directed to preferred embodiments of the invention, it will be understood and appreciated by those skilled in the art that other variations and modifications may be made without departing from the spirit and scope of the invention, and therefore the invention includes the full range of equivalents of the features and aspects set forth in the appended claims. Although the above description has been directed to preferred embodiments of the invention, it will be understood and appreciated by those skilled in the art that other variations and modifications may be made without departing from the spirit and scope of the invention, and therefore the invention includes the full range of equivalents of the features and aspects set forth in the appended claims.

I claim:

1. A FET oscillator system having an oscillator with an active amplifier element and a feedback network, said oscillator having oscillator output frequency and receiving a frequency control signal, said oscillator output frequency having first frequency variations induced by said amplifier element temperature variations and second frequency variations induced by variations in said frequency control signal, comprising:
   means for measuring temperature of said active amplifier element;
   adjusting means for providing said variations in said frequency control signal in accordance with said temperature variations;
   said adjusting means having reference voltage means and correction means both responsive to said temperature for determining said variations in said frequency control signal in accordance with said temperature variations;
   means within said active amplifier element for receiving said variations in said frequency control signal to induce said second frequency variations;
   said frequency control signal being a voltage to power said active amplifier;
   said voltage having a predetermined value for each value of said temperature; and,
   said second frequency variations compensating said first frequency variations to provide a constant oscillator output frequency.

2. The FET oscillator system-of claim 1, wherein said correction means comprises temperature responsive comparators.

3. The FET oscillator system-of claim 1, wherein said correction means comprises temperature responsive memory.

4. The FET oscillator system-of claim 1, wherein said adjusting means comprises additional frequency control signal feedback means for applying said frequency control signal to said adjusting means and feedback control signal providing means for determining said frequency control signal in accordance with said feedback control signal.

5. The FET oscillator system of claim 2, further comprising frequency control signal means for adjusting said frequency control signal in accordance with a further frequency control input signal.

6. A FET oscillator system having an oscillator with an active amplifier element and a feedback network, said oscillator having oscillator output frequency and receiving a frequency control signal, said oscillator output frequency having first frequency variations induced by said amplifier element temperature variations and second frequency variations induced by variations in said frequency control signal, comprising:
   means for measuring a temperature of said active amplifier element;
   adjusting means for providing said variations in said frequency control signal in accordance with said temperature variations;
   said adjusting means having a look-up table means for determining said variations in said frequency control signal in accordance with said temperature variations;
   means within said active amplifier element for receiving said variations in said frequency control signal to induce said second frequency variations;
   said frequency control signal being a voltage to power said active amplifier;
   said voltage having a predetermined value for each value of said temperature; and,
   said second frequency variations compensating said first frequency variations to provide a constant oscillator output frequency.

7. The FET oscillator system of claim 3, further comprising frequency control signal means for adjusting said frequency control signal in accordance with a further frequency control input signal.

* * * * *